United States Patent [19]

Przano

[11] Patent Number: 5,714,792
[45] Date of Patent: Feb. 3, 1998

[54] SEMICONDUCTOR DEVICE HAVING A REDUCED DIE SUPPORT AREA AND METHOD FOR MAKING THE SAME

[75] Inventor: Michael C. Przano, Pfugerville, Tex.

[73] Assignee: Motorola, Inc., Schaumburg, Ill.

[21] Appl. No.: 315,545

[22] Filed: Sep. 30, 1994

[51] Int. Cl.[6] ............................................. H01L 23/495
[52] U.S. Cl. ................................... 257/670; 257/667
[58] Field of Search ..................... 257/667, 670, 257/679

[56] References Cited

U.S. PATENT DOCUMENTS

| | | | |
|---|---|---|---|
| 3,629,688 | 12/1971 | Hingorany | 257/670 |
| 3,708,730 | 1/1973 | Schierz et al. | 317/234 |
| 4,307,297 | 12/1981 | Groff et al. | 250/551 |
| 4,612,564 | 9/1986 | Moyer | 357/70 |
| 4,791,473 | 12/1988 | Phy | 257/670 |
| 4,829,362 | 5/1989 | Tran et al. | 357/70 |
| 4,868,635 | 9/1989 | Frechette et al. | 357/70 |
| 4,924,291 | 5/1990 | Lesk et al. | 357/70 |
| 4,949,160 | 8/1990 | Ohno | 357/70 |
| 4,994,895 | 2/1991 | Matsuzaki et al. | 357/81 |
| 5,010,390 | 4/1991 | Tanaka | 257/21 |
| 5,021,864 | 6/1991 | Kelly et al. | 357/70 |
| 5,021,865 | 6/1991 | Takahashi et al. | 357/70 |
| 5,161,304 | 11/1992 | Queyssac et al. | 29/827 |
| 5,521,428 | 5/1996 | Hollingsworth et al. | |

FOREIGN PATENT DOCUMENTS

| | | | |
|---|---|---|---|
| 63-40352 | 2/1988 | Japan | H01L 2/50 |
| 63-40352A | 2/1988 | Japan | |
| 64-80051 | 3/1989 | Japan | H01L 23/50 |
| 4-15947 | 1/1992 | Japan | H01L 23/50 |

Primary Examiner—Stephen Meier

[57] ABSTRACT

A semiconductor device (10) having a reduced die support area (24) includes a semiconductor die (11) having a plurality of bond pads (17) which are electrically coupled to a plurality of leads (16) by wire bonds (15). The die is supported solely by two cantilevered tie bars (20). Use of cantilevered tie bars decreases the total plastic-metal interface area in a plastic encapsulated device, thereby lessening the probability of internal delamination and package cracking. The cantilevered tie bars also permit a variety of die sizes to be used with the same leadframe design. Optionally, a power supply bar may be used to connect the two tie bars to provide an electrical bus for the device.

18 Claims, 2 Drawing Sheets

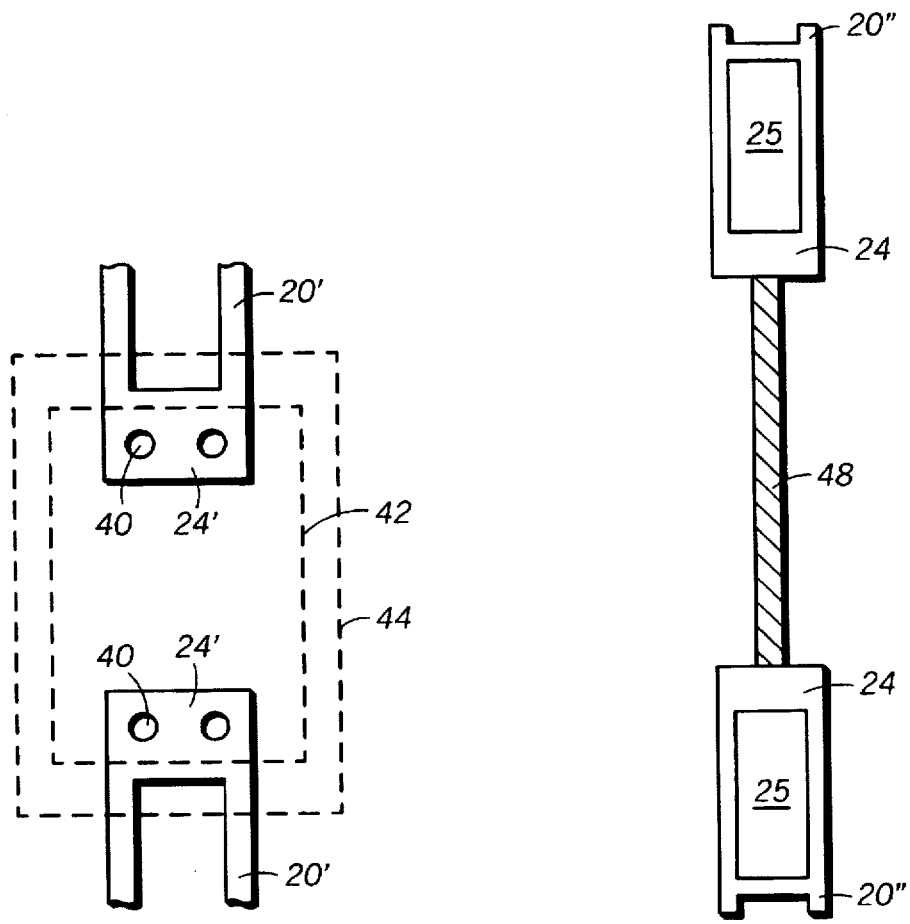
FIG.3   FIG.4
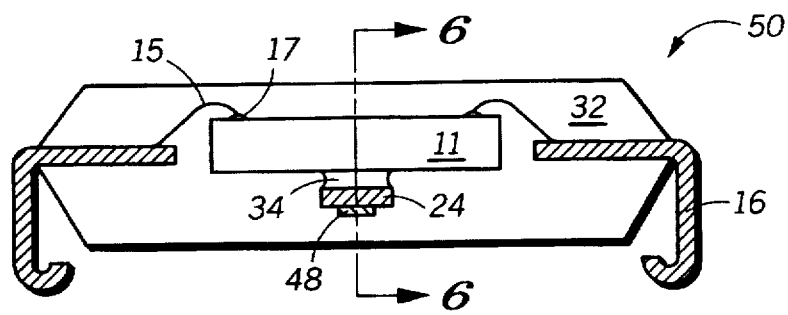
FIG.5
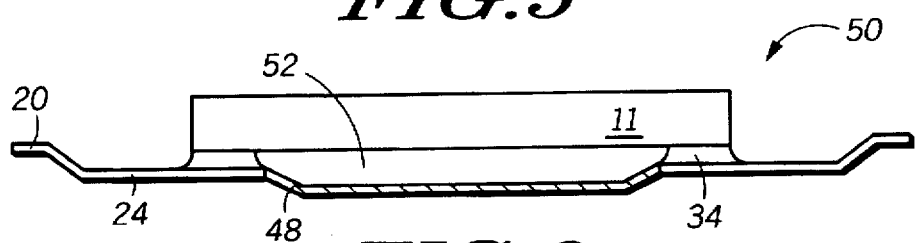
FIG.6

SEMICONDUCTOR DEVICE HAVING A REDUCED DIE SUPPORT AREA AND METHOD FOR MAKING THE SAME

CROSS-REFERENCE TO RELATED APPLICATION

The present application is related to commonly assigned, co-pending patent applications entitled "Semiconductor Device Having Universal Low-Stress Die Support and Method for Making the Same," by Frank Djennas et al., application Ser. No. 08/035,422, and to "Flagless Semiconductor Device and Method for Making the Same," by Tom R. Hollingsworth et al., application Ser. No. 08/034,961, both filed Mar. 22, 1993.

FIELD OF THE INVENTION

The present invention relates generally to semiconductor devices, and more specifically to semiconductor devices having reduced die support areas and methods for making the same.

BACKGROUND OF THE INVENTION

Package cracking is a common problem in plastic encapsulated semiconductor devices. The problem arises from a combination of factors. One factor is an internal delamination between the plastic encapsulant material and a flag of a leadframe. The flag is a plate-like member of a conventional leadframe which supports the die. The flag, like the rest of the leadframe, is usually made of copper, a copper-alloy, or an iron-nickel alloy, and therefore has a coefficient of thermal expansion (CTE) which in most instances is different than that of the surrounding molding compound or plastic. As a result of this CTE mismatch, stress is created at the plastic-flag interface as the semiconductor device experiences temperature changes. The stress, upon reaching a maximum threshold, is relieved through delamination of the plastic-flag interface. Another factor involved in package cracking is moisture absorption. After the plastic-flag interface becomes delaminated, moisture from the environment diffuses through the molding compound to the delaminated area. Once moisture accumulates in the package, a rapid temperature increase will cause the moisture to vaporize and expand, thereby creating an internal pressure pocket in the delaminated area. To relieve the pressure and associated stress, the surrounding plastic cracks. The most common occurrence of package cracking occurs when a user attaches a plastic semiconductor device to a substrate using a solder reflow operation. The high temperatures associated with solder reflow induce a rapid temperature increase which is often sufficient, depending on the moisture content of the device, to cause the plastic to crack.

There are numerous existing methods of dealing with the problem of package cracking. One method is dry-packing, which involves baking plastic encapsulated semiconductor devices sufficiently to reduce moisture content and packaging the devices into moisture resistant packets. Device users then attach the device before a sufficient amount of moisture to cause cracking can be re-absorbed into the package through exposure to ambient conditions. This method is effective, but significantly increases the costs of semiconductor devices due to added process steps which also require long cycle times and expensive equipment. Moreover, device users must keep track of how long devices have been exposed to the ambient conditions to assure that any absorbed moisture is insufficient to cause cracking problems.

Other known approaches have tried to decrease the possibility of internal delamination through improved adhesion between flag and the plastic. For example, some manufacturers have "roughened" the metallic surface of the flag to improve adhesion. Others have formed small holes or dimples in the flag to provide anchoring mechanism. Another approach used to improve adhesion is use of a window-frame flag. A window-frame flag is more or less a hollowed-frame that supports the die, rather than a solid paddle. Yet another approach proposes using U-shaped, T-shaped, or H-shaped supports in place of conventional flags. A drawback to this approach is that a substantial amount of leadframe material still remains in the device which then contributes to stress at the plastic to die support interface. Moreover, dry packing is not eliminated with this last approach.

The methods described above do, to some extent, decrease the possibility of delamination by providing better adhesion to the plastic encapsulating material. Similarly, the present invention has the advantage of reduced delamination, albeit through a design not previously used. However, the present invention also addresses another manufacturing problem, namely the need for semiconductor manufacturers to use a different or customized leadframe design for each of its products. Having a different leadframe design for each die size and die functional pin-out necessitates a large inventory of piece-parts and requires additional time and human resources to design a new leadframe before each product introduction. In addition to costs associated with inventory and design, the cost of the leadframes themselves are undesirably inflated because of insufficient volume to lower the cost to a minimum. Several small orders for leadframes, each requiring separate tooling, is more costly than one batch order for the same total number of leadframes all being of the same design. Thus, the cost of semiconductor manufacturing could be significantly reduced by the use of a leadframe design which could be used in conjunction with several different die sizes. The present invention achieves this goal by utilizing a leadframe in a semiconductor device which can be used with various die sizes, while at the same time improving adhesion between the leadframe and the encapsulating material to alleviate package cracking problems.

BRIEF DESCRIPTION OF THE DRAWINGS

FIG. 3 is a top-down partial view of an alternative configuration for the die support area of FIG. 1.

FIG. 4 in a top-down view of the die support area and power supply bar in accordance with a second embodiment of the present invention.

FIG. 5 illustrates in cross-section a semiconductor device using the die support and power supply bar of FIG. 4.

FIG. 6 illustrates a cross-sectional side view along line 6—6 of FIG. 5.

DETAILED DESCRIPTION OF A PREFERRED EMBODIMENT

Figure 1:
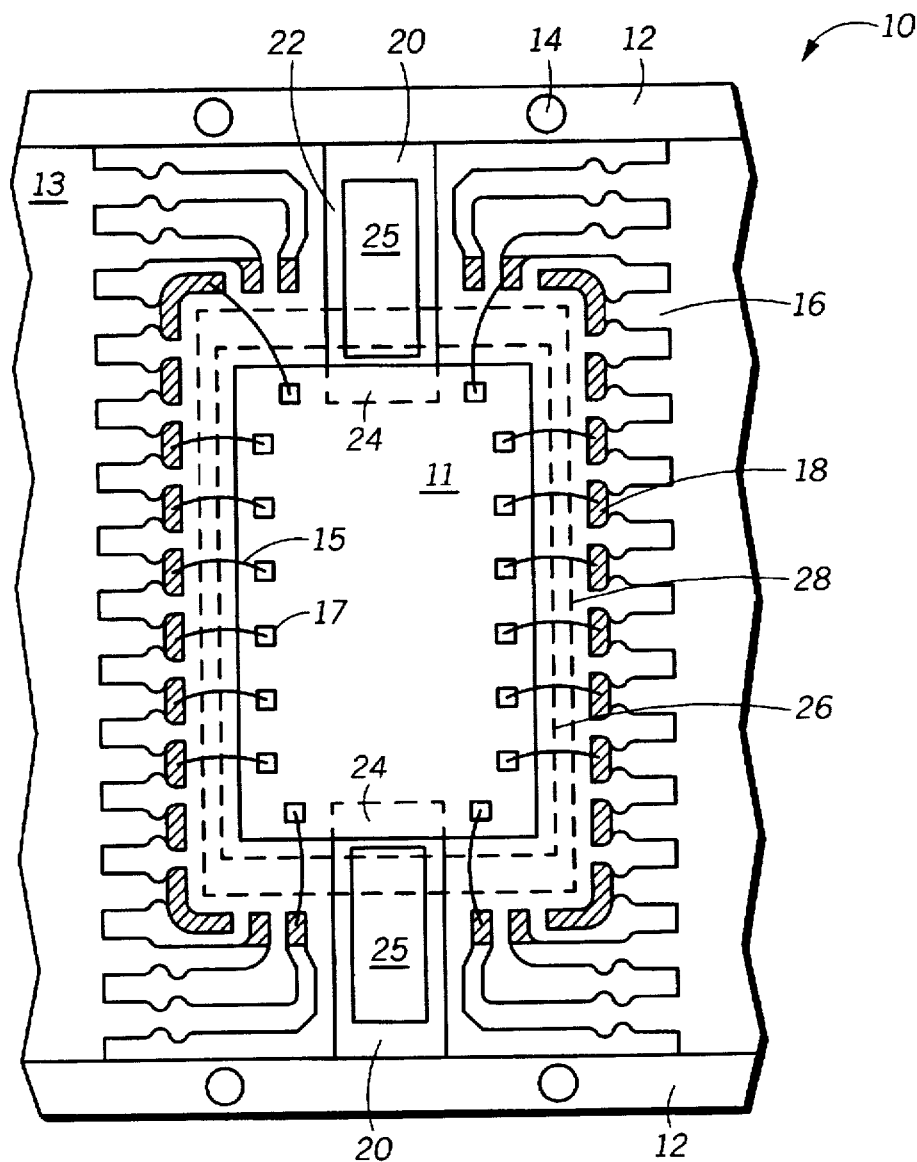
FIG. 1 is a top-down view of a partially assembled semiconductor device in a first embodiment of the present invention.

The present invention is able to substantially reduce the likelihood of internal package delamination without needing to dry-pack, while at the same time creating a universal design which can be used with several different die sizes, by utilizing cantilevered tie bars to support a semiconductor die. Generally, an embodiment of the present invention comprises a rectangular semiconductor die solely supported by two cantilevered tie bars of a leadframe. The leadframe itself is flagless. Additionally the die is electrically connected to a plurality of leads of the leadframe. A package body encapsulates the semiconductor die. Also within the scope of the invention are methods for making this and such other semiconductor devices.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Moreover, the various figures illustrate many of the same or substantially similar elements. Therefore, like reference numerals will be used to designate the same or substantially similar elements throughout the figures.

FIG. 1 illustrates both the universal aspect of a leadframe used in accordance with the present invention and the nature in which tie bars, rather than a flag, are used to support a semiconductor die. FIG. 1 is a top-down view of a partially assembled semiconductor device 10 in accordance with a first embodiment of the present invention. The device 10 has a semiconductor die 11, a leadframe 13, and a plurality of conventional bonding wires 15 connecting a plurality of bonding pads 17 on the die 11 to the leadframe 13. The leadframe 13 has a set of opposing rails 12 which contain indexing holes 14. Indexing holes are generally used to move leadframes through the assembly equipment during the device assembly or manufacturing process. The exact locations of the indexing holes 14 and their size are not relevant to the practicing of the present invention because they are determined by assembly equipment type. The leadframe 13 also has a plurality of leads 16 which extend inwardly to define a rectangular central die receiving area. At the innermost portion of the leads 16 are bonding posts 18 which are typically silver-plated. The silver-plating is done to facilitate the adhesion of the bonding wires 15 to the bonding posts 18. Methods of wire bonding are known in the art.

Leadframe 13 is formed of a common leadframe material, such as copper, a copper-alloy, an iron-nickel alloy, or the like, and is manufactured using conventional processes, for example by metal etching or stamping. Unlike conventional leadframes, leadframe 13 is flagless, thus substantially reducing the die support area. Traditionally, a plate-like member called a flag or paddle is connected to tie bars to provide a mounting area for a semiconductor die. In accordance with the present invention, a flag is not used. Instead, cantilevered tie bars are solely used to support the die. Illustrated in FIG. 1 are exactly two tie bars 20 which extend from the opposing rails 12 into the die receiving area without extending beyond one another. Each tie bar 20 has a straight stem portion 22 which terminates as a support portion 24 within the die receiving area. The support portion 24 is substantially the same width as the straight stem portion. A preferred width for the support portion of the tie bar is approximately in a range from 1.5 to 2.5 millimeters (mm). It is desirable to limit the support portions to this small range for reasons which will become apparent with subsequent discussion. Although it is not a requirement of the present invention, the tie bar may be downset in the stem portion 22 such that the support portion 24 is at a lower plane than the plurality of leads 16. Downsetting is desirable to balance the semiconductor die within the finished packaged device and to reduce overall height of the bonding wire loop height. A preferred downset range for the tie bars is approximately in the range of 0.1 to 0.5 mm.

The universal nature of leadframe 13 is apparent through the dashed outlines 26 and 28 in FIG. 1 depicting that various semiconductor die sizes may also be used with the same leadframe. Because a flag is not used, a new leadframe need not be designed for use with several different semiconductor die sizes. In conventional semiconductor devices, a flag used to support a semiconductor die is made the same shape as the die only slightly larger. The purpose of utilizing a flag is to support the die during assembly operations, primarily the step of wire bonding, and during general handling of the device up to the point of encapsulation. Once the die is encapsulated in plastic, a die support member is no longer necessary. The leadframe 13 of the present invention allows a number of die sizes to be used without the need to create a customized leadframe design for each die size, thus reducing the tooling and leadframe costs.

The tie bars 20 may optionally include an aperture 25 in the straight stem portion which can be advantageous in a subsequent molding step by providing an interlocking hole for two halves of a package body. Additionally, the presence of the apertures decrease the amount of leadframe material which can translate into material savings. Furthermore, since the goal is to minimize the amount of leadframe material contacting the semiconductor die, the presence of the apertures helps to reduce the area of the die support portions when the die size is larger, as depicted by dashed outline 28.

The semiconductor die 11 is mounted and affixed to the support portions 24 of the two tie bars 20. Accordingly, a die attach adhesive is dispensed onto those portions of the cantilevered tie bars which will support the die. For example, in FIG. 1 adhesive would be dispensed on the portions of tie bars 20 illustrated by a dashed line. Upon pressing the die against the tie bars to effect the bond, adhesive will be squeezed outward to form a fillet along the perimeter of the tie bars, not around the perimeter of die. This "inverted" fillet is illustrated in a cross-sectional perspective in the completed semiconductor device 10 of FIG. 2.

It is important to note that as illustrated in FIG. 1, the semiconductor device is only partially assembled. The device is not yet encapsulated in a plastic package body. As one of ordinary skill in the art would recognize, device 10 is subsequently encapsulated in a plastic encapsulating material and then excised from leadframe 13 to form completed devices, such as those shown in FIGS. 2 and 4. As a result of being excised, tie bars 20 are no longer joined to rails 12 but are instead severed and flush with an edge of the package body. Leads 16 are severed and subsequently formed into one of several external lead configurations, such as gull-wing (as shown in FIG. 2), J-lead (as shown in FIG. 4), or through-hole configurations.

Figure 2:
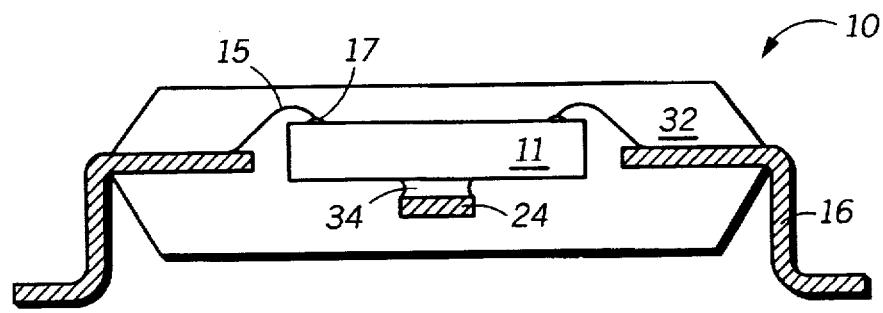
FIG. 2 illustrates in cross-section the completed semiconductor device of FIG. 1 having a reduced die support area.

In FIG. 2, device 10 includes the semiconductor die 11 attached to a cantilevered tie bar 20. The device is encapsulated in a plastic package body 32. Plastic package body 32 can be formed through a transfer molding process, which is well established in the art, typically used for a thermosetting epoxy molding compound. Alternatively, an injection molding process may be utilized to form the plastic package body 32 if a thermoplastic material were to be used. The die 11 is electrically coupled to a plurality of leads 16 by bonding wires 15. Leads 16 are as illustrated in a gull-wing configuration, although J-lead and through-hole configurations may also be used. Die 11 is bonded to the tie bars by a conventional die attach adhesive 34, such as a silver filled paste thermoset epoxy or a B-stage preform epoxy. Alternatively, a thermoplastic adhesive or a solder material may be used as the die attach adhesive. In the case of a silver filled paste, the epoxy should form an inverted fillet as illustrated in FIG. 2. Like in conventional devices, a bond can be evaluated by the continuity of the epoxy fillet. However, inspection of an inverted fillet requires examination from the bottom of the device, which may require slight changes in a manufacturer's inspection process, if an inspection process is used.

In utilizing these straight tie bars as a die support rather than a flag, the total plastic-metal interface area, once the device is encapsulated in plastic, is reduced. For purposes of describing the present invention, the phrase plastic-metal interface is used rather than plastic-flag interface since embodiments of the present invention do not have conventional flags. As a consequence of reducing the plastic-metal interface area, the area in which plastic is directly in contact with the semiconductor die is increased. Together, the reduction in plastic-metal interface area and the increase in plastic-die interface area reduces the chances of internal delamination because most plastic encapsulating materials will adhere to the die better than to a metal surface. Furthermore, if delamination happens to occur at the interface between one of the tie bars and the encapsulating plastic, the interface of the other tie bar with the plastic is unaffected.

Although various die sizes can be used with the same leadframe design in devices in accordance with the present invention, there are limits to the die size employed. For instance, the die size and shape of semiconductor die 11, 26 and 28 (as represented by the dashed outlines) of FIG. 1 are imposed by inner portions of leads 16 which define the die receiving area. Another limitation to the die size used with leadframe 13 may be wire bond length. As the die size becomes smaller, the length of the bonding wires 15 needed to electrically couple the die 11 to leads 16 increases. Thus, a manufacturer's upper limit on wire bond length will also set a lower limit on die size.

Since a flag is not employed, it may be necessary to modify existing assembly procedures in making a device in accordance with the present invention. For instance, as noted in the discussion above, a dispense pattern for a die attach adhesive is limited to a small tie bar area rather to the area of an entire flag. Therefore, tooling modifications for adhesive dispense heads and dispense patterns may be necessary. Also, a smaller amount of die attach adhesive is needed with the present invention since the die support area (the tie bars) is smaller than a conventional flag. In addition, tighter process control for die attach dispense may be needed. Since the die overhangs the tie bars entirely, it is possible for the adhesive to spread beyond the tie bars when attaching a semiconductor die, thereby contaminating an underlying tooling platform. Thus, the upper limit on the amount of adhesive should be tightly monitored. At the same time, however, it is important that enough adhesive be dispensed to provide the proper fillet, as discussed above.

Another processing modification may be useful during wire bonding. Since a semiconductor die is not fully supported along the die periphery, it may be advantageous to provide peripheral die support during wire bonding. Bond pads are generally, but not always, located around the periphery of the die. Thus, to bond a wire to each bond pad a wire bonding tool must exert pressure on the die perimeter each time it forms a bond. If the wire bonding force is high enough, or alternatively if the die is not flexible enough, there is a risk that the force exerted will cause an unsupported portion of the die to crack or chip. Therefore, it may be desirable to incorporate a support mechanism into the wire bonding platform. For instance, the platform may be designed to include a cut-out or channel which matches the pattern and thickness of the cantilevered tie bars so together the platform and tie bars form a substantially planar and continuous surface. As a result the entire die would be supported by a combination of the tie bars and platform during the wire bonding operation. It is important to note that modifications to existing wire bonding operations may not be needed in practicing the present invention. The need for modifications will depend on various factors, including bonding force, die thickness, die size, and bond pad location to name a few.

An alternative tie bar configuration is illustrated in FIG. 3, which is a top-down illustration of only a portion of a semiconductor device, namely the tie bar portions. As illustrated in FIG. 3, exactly two cantilevered tie bars 20' extend toward each other without making contact. Moreover, the support portion 24' of the tie bars have a plurality of holes 40 therein. These holes serve as a locking mechanism for the tie bar and the die because molding compound can flow into the holes and adhere to the back surface of the die during encapsulation. The outer ends of the tie bars extend to rails of a leadframe (not shown) as in previously illustrated embodiments. Like previous embodiments of the invention, the total metal surface area is reduced to help prohibit delamination once the tie bars are encapsulated in plastic. The tie bars 20' can also accommodate various die sizes as indicated by dashed lines 42 and 44 which represent two different semiconductor dice. As illustrated, it can be seen that the two "short" sides of a semiconductor die are supported. However, in memory devices in particular, usually the "long" sides of a semiconductor die have associated bond pads. In order to support the long sides of a semiconductor die in a stable manner, the tie bars 20' should provide support to the semiconductor die along the midline of the die.

Yet another tie bar configuration within the scope of the present invention is illustrated in FIG. 4. The two cantilevered tie bars 20" are connected to each other by a power supply bar 48 in the die receiving area. The power supply bar enables bussing of the device current from one end to the die to the opposing end. The power supply bar preferably has a width approximately in a range of 0.3 to 0.5 mm. As can be seen the width of the power supply bar should be substantially narrower or smaller than the width of the support portions of the tie bar to minimize the amount of metal or leadframe material in the device. Moreover, while it is not critical that the power supply bar 48 be downset from the support portion 24 of the tie bar, it is preferable to downset so that molding compound can flow between the power supply bar and the backside of the die to eliminate the need for die attach adhesive between the backside and the power supply bar. The downset of the power supply bar is preferably in a range from 0.1 to 0.25 mm. Outer ends of the tie bars extend to rails of a leadframe (not illustrated). Like in other configurations illustrated, various semiconductor die sizes can be used.

FIGS. 5 and 6 illustrate in cross-section a semiconductor device 50 using the die support and power supply bar of FIG. 4. As shown in FIG. 5, device 50 has semiconductor die 11 mounted and affixed to the die support portion 24 of the tie bar. The power supply bar 48 is downset from the die support portion 24. Also, it should be noted that the die support portion is non-planar with the inner portions of the leads 16. The amounts of downset for both the tie bars and the power supply bar are the same as discussed above. The outer lead configuration for the device 50 is illustrated as J-lead, but other lead configurations may also be used, such as gull-wing and through-hole.

FIG. 6 offers another cross-sectional perspective along line 6—6 of FIG. 5 to help illustrate the nature of the downset involved with this embodiment of the invention. For clarity and ease of illustration, the package body and the leads have been omitted in this view. As can be easily seen from FIG. 6, the power supply bar 48 is not in intimate contact with the backside of the semiconductor die 11. Instead, there is a gap 52 which can be filled with molding compound during the encapsulation of the device. An advantage to having this gap is that maximum die-plastic interface can be maintained, while allowing the requisite bussing to take place.

Applications of the various embodiments of the present invention are most suited for small outline J-leaded devices (SOJs) and thin small outline packages (TSOPs) because these devices are rectangular in nature and have leads exiting from only two sides of the package body. Typically, memory dice are packaged within SOJs and TSOPs although the invention is not limited to memory applications but is applicable to any type of devices requiring leads along only two sides of the package body.

To confirm the advantages of the present invention, an experiment was conducted wherein 200 semiconductor devices using the embodiment of FIG. 1 were manufactured according to the methods described above. The semiconductor dice used were memory devices having dimensions of 7.5×11.0 mm. These dice were assembled into a 28-lead SOJ (10.1×18.4 mm) package type having a copper alloy leadframe. A silver filled epoxy paste was used to affix the die to the support portions of the tie bars. A modified epoxy dispensing tool was utilized to obtain the appropriate die attach material coverage on the support portions. In addition, the wire bond heater block was modified with channels to support the tie bar portions. No tooling modification was needed for molding. Basically, standard assembly processes were used to manufacture these devices except the tooling modifications listed. No manufacturing problems were observed for any of the processes.

Next, three separate reliability stress tests were performed on 30 assembled samples per reliability test. These reliability stress tests consisted of conditioning the samples at a predetermined temperature and relative humidity level in order saturate the devices with moisture. The conditions for the three tests were 30° C. at 60% relative humidity, 85° C. at 60% relative humidity, and 85° C. at 85% relative humidity. After the samples were subjected to 168 hours of at these conditions, such that the samples were fully saturated with moisture, each group were subjected to four cycles of vapor phase. Vapor phase is a simulation of the solder reflow process, which is most often the cause of package cracking or delamination. A single cycle of the vapor phase process comprises dipping the devices into a bath of perfluorocarbon or fluoroinert maintained at a temperature of 215° C. for 120 seconds. After vapor phase, the samples were nondestructively tested using ultrasound equipment to check package integrity. Only 1 sample out of the 90 tested showed delamination at the tie bar to mold compound interface. However, even this delamination was minimal, and the device would have passed inspection. None of samples showed any package cracks. The results from the experiment demonstrates that dry-packing may be eliminated in practicing the present invention because even fully saturated devices do not fail when an embodiment of the invention is used.

The foregoing description and illustrations contained herein demonstrate many of the advantages associated with the present invention. In particular, it has been revealed that cantilevered tie bars can be solely used to support a semiconductor to decrease the total plastic-metal interface within a plastic encapsulated device. Consequences of the reduced plastic metal interface are a reduction in the chances of internal delamination at the interface, thereby lessening the chances for package cracking. Moreover, the fact that the cantilevered tie bars are physically separated from one another decreases any delamination area which might occur. If a delamination develops at the interface of one tie bar and an encapsulating plastic, the delaminated area will not propagate to the other tie bar. In other words, delamination at each of the two tie bars occurs independently of the other. Moreover, the need for dry-packing of semiconductor devices can be eliminated thus saving time and equipment costs. An additional benefit of the present invention is that the use of cantilevered tie bars enables a variety of die sizes to be supported by the tie bars. Yet another advantage is that the present invention can be implemented with no increase in piece-part costs. A leadframe used in accordance with the present invention can be manufactured at the same price as existing leadframes, or at a lower price due to higher volumes. Other manufacturing cost increases associated with optional tooling modifications are minimal. Additionally, a power supply bar may be used when bussing is desired.

Thus it is apparent that there has been provided, in accordance with the invention, a semiconductor device having reduced die support areas and methods for making the same, that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not specifically limited to any particular package size. It is also important to note that either the tie bars or the power supply bar of a device or both may be downset with respect to leads of the device to position the die at a desired level or height within the device. In addition, tie bars of a device in accordance with the present invention may include alignment features to aid in the alignment of a semiconductor die during die bonding. In addition, it is noted that the present invention is not limited in any way to the type of semiconductor die used within the device. While it is likely that devices which employ memory die will reap the most benefit from the present invention, other die types (such as micro-controllers, analog devices, etc.) may certainly be used. Therefore, it is intended that this invention encompass all such variations and modifications falling within the scope of the appended claims.

I claim:

1. A flagless semiconductor device comprising:
   a flagless leadframe comprising:
   a plurality of leads having inner lead portions and outer lead portions, wherein the inner lead portions define a die receiving area having two opposing sides;
   exactly two tie bars extending into the die receiving area from the two opposing sides of the die receiving area without extending beyond one another, each tie bar having a straight stem portion for physical connection to a handling rail and a support portion extending rectilinearly from the straight stem portion within the die receiving area such that the entirety of each tie bar is substantially straight, each support portion terminating at an edge, the edges facing each other to form a space therebetween that is unoccupied by any other leadframe member, wherein the support portion is substantially a same width as the straight stem portion;

a semiconductor die having two opposing peripheral portions and a central portion, the two opposing peripheral portions of the die being attached to the support portions of the exactly two tie bars such that the central portion of the semiconductor die spans the space between the exactly two tie bars and is not supported by the any other member of the leadframe;

means for electrically coupling the semiconductor die to the inner portions of the leads; and a package body encapsulating the semiconductor die and the inner lead portions of the plurality of leads.

2. The semiconductor device of claim 1 wherein the straight stem portion of the tie bar has a hole therein such that a top half and a bottom half of the package body are interlocked through the hole.

3. The semiconductor device of claim 1 further comprising a power supply bar having a width narrower than the width of the straight stem portion, the power supply bar connecting the exactly two tie bars within the die receiving area.

4. The semiconductor device of claim 3, wherein the power supply bar is vertically downset from the support portions of the exactly two tie bars substantially in a range of 0.1 to 0.25 millimeter.

5. The semiconductor device of claim 3, wherein the power supply bar has a width substantially in a range from 0.3 to 0.5 millimeter.

6. The semiconductor device of claim 1, wherein each of the exactly two tie bars has a width substantially in a range from 1.5 to 2.5 millimeters.

7. The semiconductor device of claim 1, wherein the package body has four sides, and wherein the outer lead portions of the plurality of leads extend outward from two opposing sides of the package body, and wherein each of the exactly two tie bars has an end which is substantially flush with one of the remaining two sides as a result of being severed from the leadframe.

8. The semiconductor device of claim 1, wherein the semiconductor die has a length which has a midline, and wherein the support portions of the exactly two tie bars support the semiconductor die along the midline.

9. The semiconductor device of claim 1, wherein the straight stem portions of the exactly two tie bars are approximately at 90° to the outer lead portions of the plurality of leads.

10. The semiconductor device of claim 1, wherein each of the exactly two tie bars has a vertical downset between the straight stem portion and the support portion, the vertical downset being substantially in a range from 0.1 to 0.5 millimeter.

11. A flagless semiconductor device comprising:

a plurality of leads having inner lead portions and outer lead portions, wherein the inner lead portions together define a die receiving area having two first opposing sides and two second opposing sides, wherein the first opposing sides are each shorter than each of the second opposing sides;

only one tie bar extending into the die receiving area from each of the two first opposing sides, such that there are exactly two tie bars in the device, wherein each of the exactly two tie bars has a stem portion, for physical connection to a handling rail, and a support portion which terminates within the die receiving area, the stem portion of each tie bar being approximately at 90° to the outer lead portions of the plurality of leads, wherein the support portion is substantially of a same width as the stem portion, and wherein there exists a space between the support portions of the exactly two tie bars which is unoccupied by any other leadframe member;

a semiconductor die attached to and supported by the support portion of the exactly two tie bars such that the semiconductor die spans the space between the support portions of the exactly two tie bars;

a plurality of wire bonds electrically connecting the semiconductor die to the plurality of leads; and a polymer resin package body encapsulating the semiconductor die and inner lead portions of the plurality of leads.

12. The semiconductor device of claim 11, wherein the exactly two tie bars are physically separated from each other and extend into the die receiving area without passing each other.

13. The semiconductor device of claim 11, wherein the stem portion of the tie bar has a hole therein such that a top half and a bottom half of the package body are interlocked through the hole.

14. The semiconductor device of claim 11, further comprising a power supply bar having a width narrower than the width of the stem portion, the power supply bar connecting the support portions of the exactly two tie bars within the die receiving area.

15. The semiconductor device of claim 14, wherein the power supply bar is vertically downset from the support portions of the exactly two tie bars substantially in a range of 0.1 to 0.25 millimeter.

16. The semiconductor device of claim 14, wherein the power supply bar has a width substantially in a range from 0.3 to 0.5 millimeter.

17. The semiconductor device of claim 11, wherein each of the exactly two tie bars is vertically downset between the stem portion and the support portion, substantially in a range from 0.1 to 0.5 millimeter.

18. The semiconductor device of claim 11, wherein each of the exactly two tie bars has a width substantially in a range from 1.5 to 2.5 millimeters.

* * * * *